United States Patent
Chiu et al.

(10) Patent No.: US 11,121,138 B1
(45) Date of Patent: Sep. 14, 2021

(54) LOW RESISTANCE PICKUP CELLS FOR SRAM

(71) Applicant: Taiwan Semiconductor Manufacturing Co., Ltd., Hsin-Chu (TW)

(72) Inventors: Yi-Hsun Chiu, Hsinchu County (TW); Cheng-Chi Chuang, New Taipei (TW); Shang-Wen Chang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/858,460

(22) Filed: Apr. 24, 2020

(51) Int. Cl.
*H01L 21/02* (2006.01)
*H01L 21/033* (2006.01)
(Continued)

(52) U.S. Cl.
CPC .... *H01L 27/1108* (2013.01); *H01L 21/02603* (2013.01); *H01L 21/0335* (2013.01);
(Continued)

(58) Field of Classification Search
CPC ............. H01L 27/1108; H01L 27/0207; H01L 27/0921; H01L 27/0928; H01L 21/02603; H01L 21/0335; H01L 21/0337; H01L 21/0338; H01L 21/823807; H01L 21/823814; H01L 29/0673; H01L 29/42392; H01L 29/66742; H01L 29/78618; H01L 29/78696
(Continued)

(56) References Cited

U.S. PATENT DOCUMENTS 5,143,866 A    9/1992  Matsutani
6,768,144 B2   7/2004  Houston et al.
(Continued)

FOREIGN PATENT DOCUMENTS

EP        0023429       12/1985
KR     20190122114 A    10/2019

OTHER PUBLICATIONS

Yang, Chih-Chuan, et al., "Well Pick-Up Region Design for Improving Memory Macro Performance", U.S. Appl. No. 16/657,421, filed Oct. 18, 2019, 31 pages of specification, 9 pages of drawings.
(Continued)

*Primary Examiner* — Tong-Ho Kim
(74) *Attorney, Agent, or Firm* — Haynes & Boone LLP

(57) ABSTRACT

A semiconductor device includes a transistor and a memory pickup cell formed over a well in a substrate. The transistor includes a first fin having a first width and two first source/drain features on the first fin. The pickup cell includes a second fin having a second width and two second source/drain features on the second fin. The well, the first fin, the second fin, and the second source/drain feature are of a first conductivity type. The first source/drain features are of a second conductivity type opposite to the first conductivity type. The second width is at least three times of the first width. The pickup cell further includes a stack of semiconductor layers over the second fin and connecting the two second source/drain features.

20 Claims, 13 Drawing Sheets

(51) Int. Cl.

| | | |
|---|---|---|
| H01L 21/8238 | (2006.01) | |
| H01L 27/02 | (2006.01) | |
| H01L 27/092 | (2006.01) | |
| H01L 27/11 | (2006.01) | |
| H01L 29/06 | (2006.01) | |
| H01L 29/423 | (2006.01) | |
| H01L 29/66 | (2006.01) | |
| H01L 29/786 | (2006.01) | |

(52) U.S. Cl.
CPC ...... *H01L 21/0337* (2013.01); *H01L 21/0338* (2013.01); *H01L 21/823807* (2013.01); *H01L 21/823814* (2013.01); *H01L 21/823892* (2013.01); *H01L 27/0207* (2013.01); *H01L 27/0921* (2013.01); *H01L 27/0928* (2013.01); *H01L 29/0673* (2013.01); *H01L 29/42392* (2013.01); *H01L 29/66742* (2013.01); *H01L 29/78618* (2013.01); *H01L 29/78696* (2013.01)

(58) Field of Classification Search
USPC .......................................................... 257/351
See application file for complete search history.

(56) References Cited

U.S. PATENT DOCUMENTS

| | | |
|---|---|---|
| 7,586,147 B2 | 9/2009 | Liaw |
| 8,310,860 B1 | 11/2012 | Houston |
| 8,693,235 B2 | 4/2014 | Liaw |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,980,763 B2 | 3/2015 | Wang et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,607,685 B2 | 3/2017 | Liaw |
| 9,625,824 B2 | 4/2017 | Lu et al. |
| 9,627,379 B1 | 4/2017 | Chang et al. |
| 9,646,973 B2 | 5/2017 | Liaw |
| 9,691,471 B2 | 6/2017 | Liaw |
| 10,050,045 B1 | 8/2018 | Hsu et al. |
| 10,314,154 B1 | 6/2019 | Hsu et al. |
| 10,460,794 B1 | 10/2019 | Liaw |
| 2008/0116400 A1 | 5/2008 | Schmidt et al. |
| 2013/0063803 A1 | 3/2013 | Delgado et al. |
| 2014/0153321 A1 | 6/2014 | Liaw |
| 2016/0049410 A1 | 2/2016 | Seshadri et al. |
| 2016/0372182 A1 | 12/2016 | Liaw |
| 2017/0110454 A1 | 4/2017 | Chang et al. |
| 2017/0125411 A1 | 5/2017 | Yu et al. |
| 2019/0067277 A1 | 2/2019 | Tsai et al. |
| 2019/0103472 A1 | 4/2019 | Cheng et al. |
| 2019/0326300 A1 | 10/2019 | Liaw |
| 2020/0098766 A1 | 3/2020 | Liaw |
| 2020/0168616 A1* | 5/2020 | Yang ................ H01L 27/11 |
| 2020/0335585 A1* | 10/2020 | Liaw ................ H01L 27/1104 |

OTHER PUBLICATIONS

Su, Hsin-Wen, et al., "Cut Metal Gate in Memory Macro Edge and Middle Strap", U.S. Appl. No. 16/441,217, filed Jun. 14, 2019, 25 pages of specification, 11 pages of drawings.

* cited by examiner

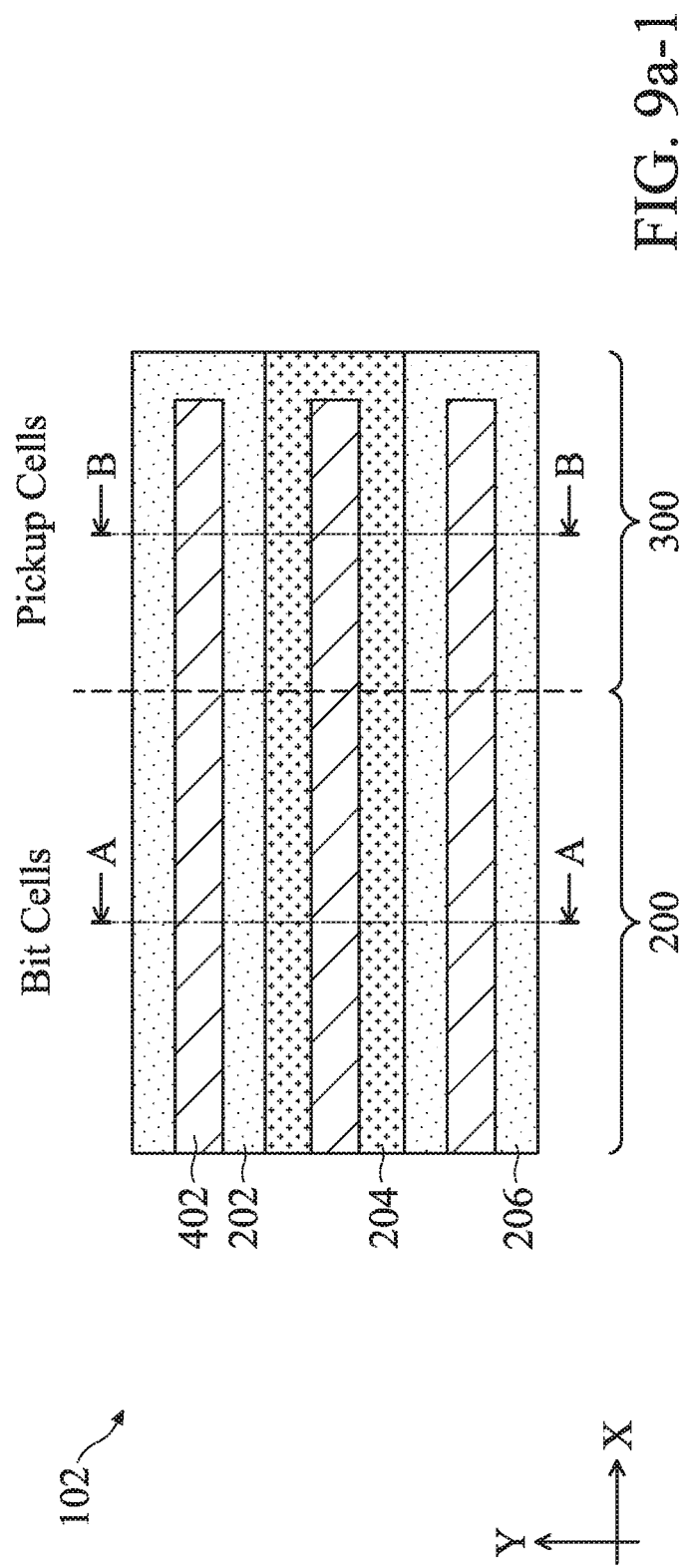
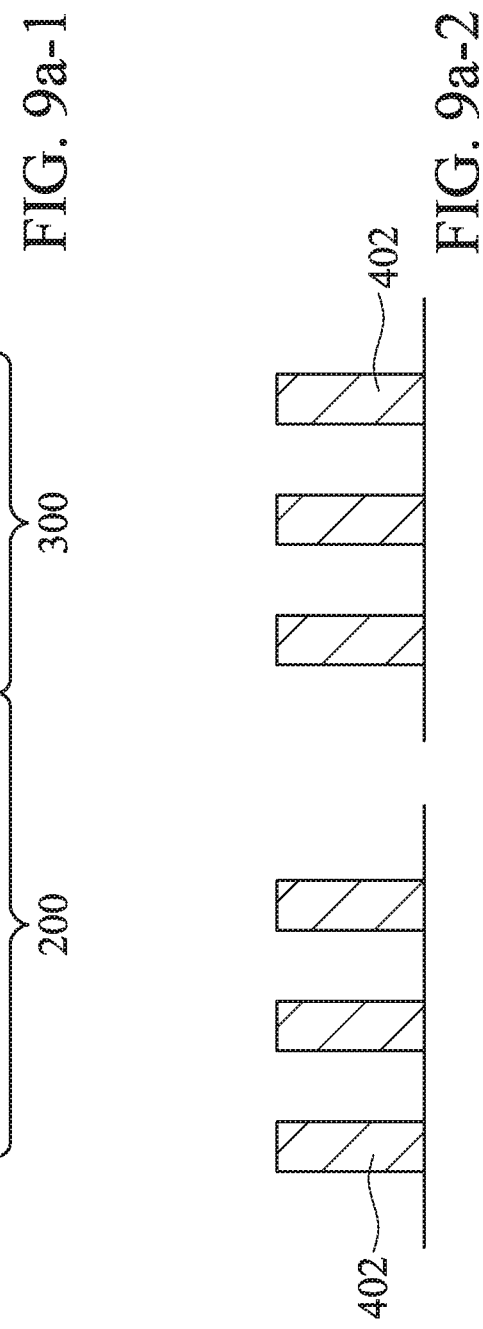
FIG. 9a-1
FIG. 9a-2

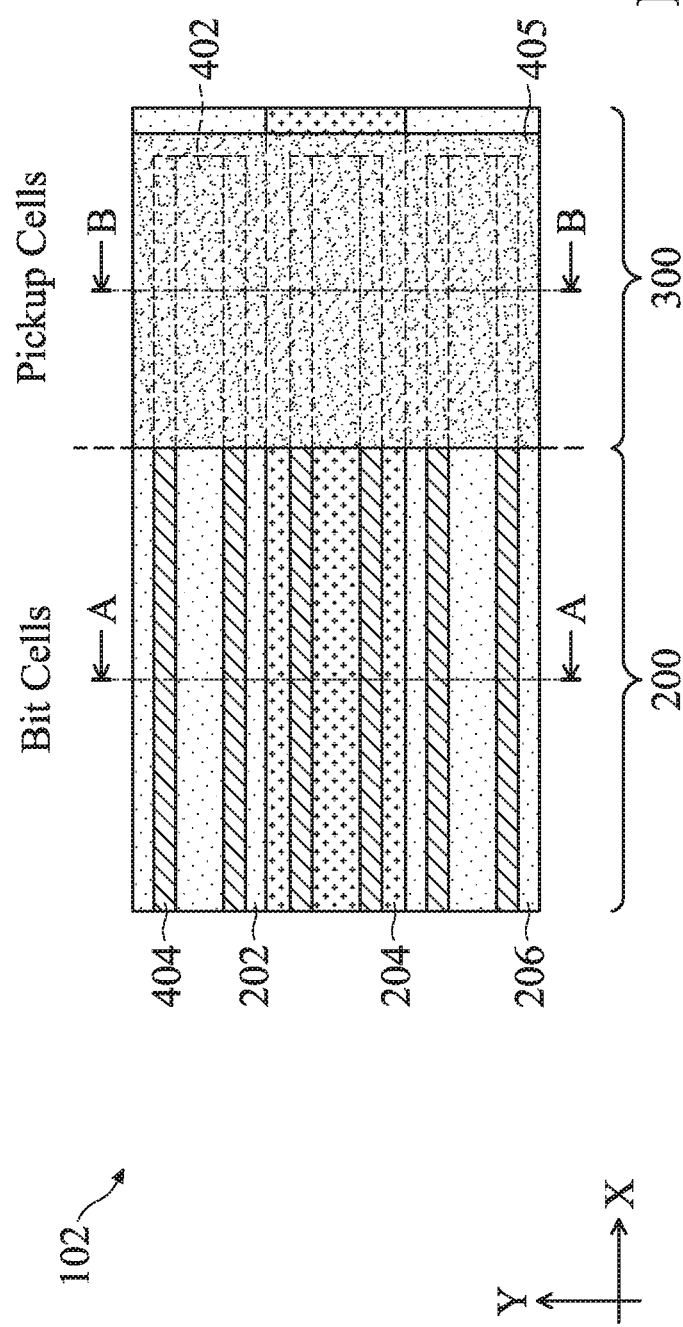
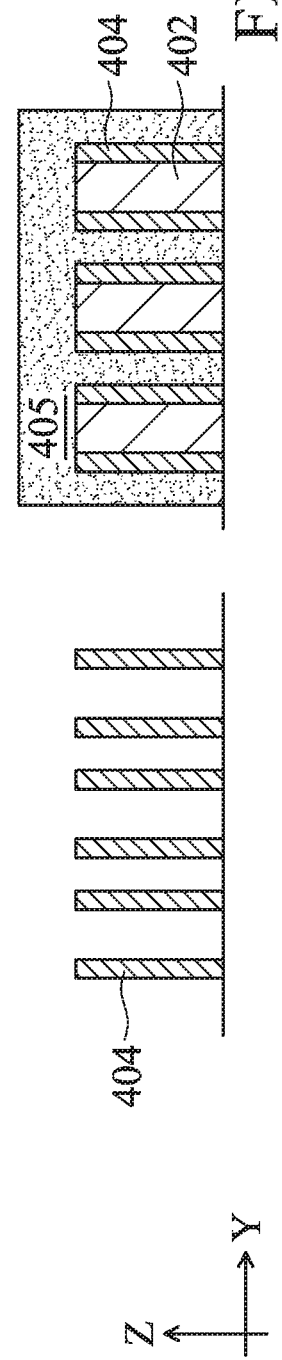
FIG. 9c-1
FIG. 9c-2

LOW RESISTANCE PICKUP CELLS FOR SRAM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in memory devices (such as static random-access memory or SRAM), leakage between adjacent n-type wells (or N wells) and p-type wells (or P wells) sometimes leads to latch-up issues. The latch-up issues become more severe as the transistors continue to scale down.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9a-1, 9b-1, 9c-1, 9d, and 9e illustrate top views of various patterns in a process of fabricating the memory macro in FIG. 1, in accordance with an embodiment. FIGS. 9a-2, 9b-2, and 9c-2 illustrate cross-sectional views of the patterns in FIGS. 9a-1, 9b-1, and 9c-1, in accordance with an embodiment.

DETAILED DESCRIPTION

Figure 1:
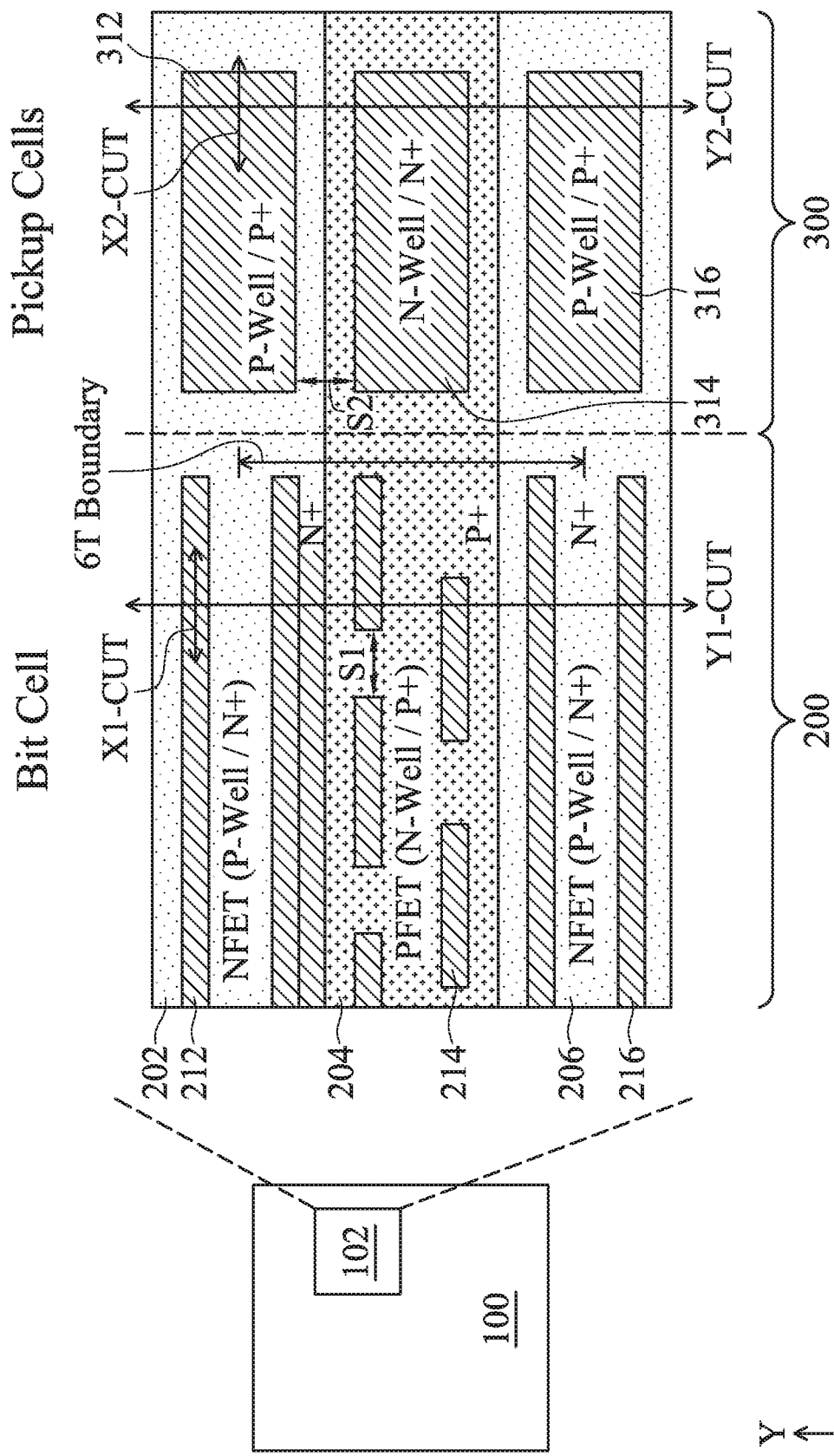
FIG. 1 is a simplified block diagram of an integrated circuit (IC) with an embedded memory, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/− 10% of the number described, unless otherwise specified. For example, the term "about 5 nm" encompasses the dimension range from 4.5 nm to 5.5 nm.

The present disclosure is generally related to semiconductor devices and fabrication methods, and more particularly to structures, layout designs, and fabrication methods for memory bit cells and memory well pickup (WPU) cells. The well pickup cells provide access to P wells and N wells underlying the transistors in the memory bit cells. The P wells and N wells (which are oppositely doped) are arranged alternately in a memory macro (i.e., every P well is next to an N well which is next to another P well) and have separate well pickup cells. Package pins or pads may be connected to the well pickup cells in a final IC for providing bias voltages to the wells. Also, tester pins may contact the well pickup cells to provide voltages to the wells during manufacturing testing.

As the transistors continue to scale down, latch-up issues in memory macros become more severe. One approach to mitigate this issue is to increase the ratio of pickup cells to memory bit cells (i.e., increasing the density of pickup cells in a memory macro). This increases the tap points for supplying bias voltage to the wells, thereby reducing the likelihood of latch-up. However, this inevitably impacts the density of the memory bit cells because more areas of the memory macro are devoted to the pickup cells. An object of the present disclosure is to mitigate the latch-up issues by providing pickup cells with reduced resistance. Particularly, the pickup cells are in the form of a gate-all-around (GAA) device and are fabricated using the same process as the transistors in the memory cells (referred to as memory cell transistors) that are formed on the same well as the pickup cells. However, the pickup cells are free of a gate contact and have a much wider active region and wider source/drain features than the memory cell transistors. The wider active region and the wider source/drain features reduce the resistance of the electrical path extending from a source/drain contact to the underlying well, thereby reducing the likelihood of latch-up issues caused by the well's leakage.

FIG. 1 shows a simplified block diagram of semiconductor device 100 with an embedded memory 102, according to various aspects of the present disclosure. The semiconductor device 100 can be, e.g., a microprocessor, an application specific integrated circuit (ASIC), a field programmable gate array (FPGA), or a digital signal processor (DSP). The exact functionality of the semiconductor device 100 is not a limitation to the provided subject matter. The memory macro 102 may be a single-port SRAM macro, a dual-port SRAM macro, other types of memory macro, or a combination thereof. The memory macro 102 includes a plurality of memory bits for storage. The semiconductor device 100 also includes peripheral logic circuits (not shown) adjacent to the memory macro 102 for implementing various functions such as write and/or read address decoder, word/bit selector, data drivers, memory self-testing, etc. Each of the memory bits and the logic circuits may be implemented with various PMOS and NMOS transistors such as planar transistors, FinFET, gate-all-around (GAA) nanosheet transistors, GAA nanowire transistors, or other types of transistors. Further, the memory macro 102 and the logic circuits may include various contact features (or contacts), vias, and metal lines for connecting the source, drain, and gate electrodes (or terminals) of the transistors to form an integrated circuit.

FIG. 1 also shows a top view (a layout) of a portion of the memory macro 102. The memory macro 102 includes one or more regions (or areas) 200 having memory bit cells (or memory cells) and one or more regions (or areas) 300 having well pickup cells. In the present disclosure, the region 200 is also referred to as memory cell region 200 and the region 300 is also referred to as well pickup (WPU) region 300. The WPU region 300 may be located at an edge of the memory macro 102. For example, there is no other cells to the right of the region 300 in FIG. 1. Alternatively or additionally, the WPU region 300 may be located at an internal area of the memory macro 102. For example, there may be memory cell regions 200 on both left and right sides of the WPU region 300. As discussed above, the WPU regions 300 provide well pickup structures for supplying voltages (or biasing) to the N wells and P wells in the memory macro 102. For a large memory macro, the voltage drop across the wells might be significant, which would result in insufficient biasing for the wells in some portion of the memory macro. Therefore, the WPU regions 300 may be optimally placed in selected areas of the memory macro 102 in order to provide sufficient biasing for all the wells of the memory macro.

In the present embodiment, the memory macro 102 includes various P wells and various N wells oriented lengthwise along the X direction and alternately arranged along the Y direction. In other words, every P well is adjacent to an N well which is adjacent to another P well, so on and so forth, along the Y direction. In the example shown in FIG. 1, the memory macro 102 includes a P Well 202, an N well 204, and another P well 206. Particularly, the wells 202, 204, and 206 extend across both the regions 200 and 300. The P wells 202 and 206 are doped with a p-type dopant, such as boron or indium. The N well 204 is doped with an n-type dopant, such as phosphorus or arsenic.

In the memory cell region 200, the memory macro 102 further includes active regions 212 over the P well 202, active regions 214 over the N well 204, and active regions 216 over the P well 206. In the WPU region 300, the memory macro 102 further includes active region 312 over the P well 202, active region 314 over the N well 204, and active regions 316 over the P well 206. The various active regions 212, 214, 216, 312, 314, and 316 are oriented lengthwise along the X direction. Particularly, the active regions 214 are spaced away from each other along the X direction by a distance S1. In some embodiments, S1 is in a range of 30 nm to 60 nm. The lower limit (e.g., 30 nm) of the range is designed to provide sufficient clearance between the active regions 214 and gate stacks (see e.g., gate stack 230 in FIG. 8) that go across that space along the Y direction. The upper limit (e.g., 60 nm) of the range is designed to limit the size of the memory cell. The active regions 312, 314, and 316 are spaced away from each other along the Y direction by a distance S2. In some embodiments, S2 is in a range of 20 nm to 60 nm. The lower limit (e.g., 20 nm) of this range is designed to provide sufficient margin for photolithography patterning process that is used for creating the active regions 312, 314, and 316 (see e.g., FIGS. 9a-9e). The upper limit (e.g., 60 nm) of this range is designed to maximize the width of the active regions 312, 314, and 316, thereby reducing the resistance of the pickup cells, which will be described later.

Figure 2:
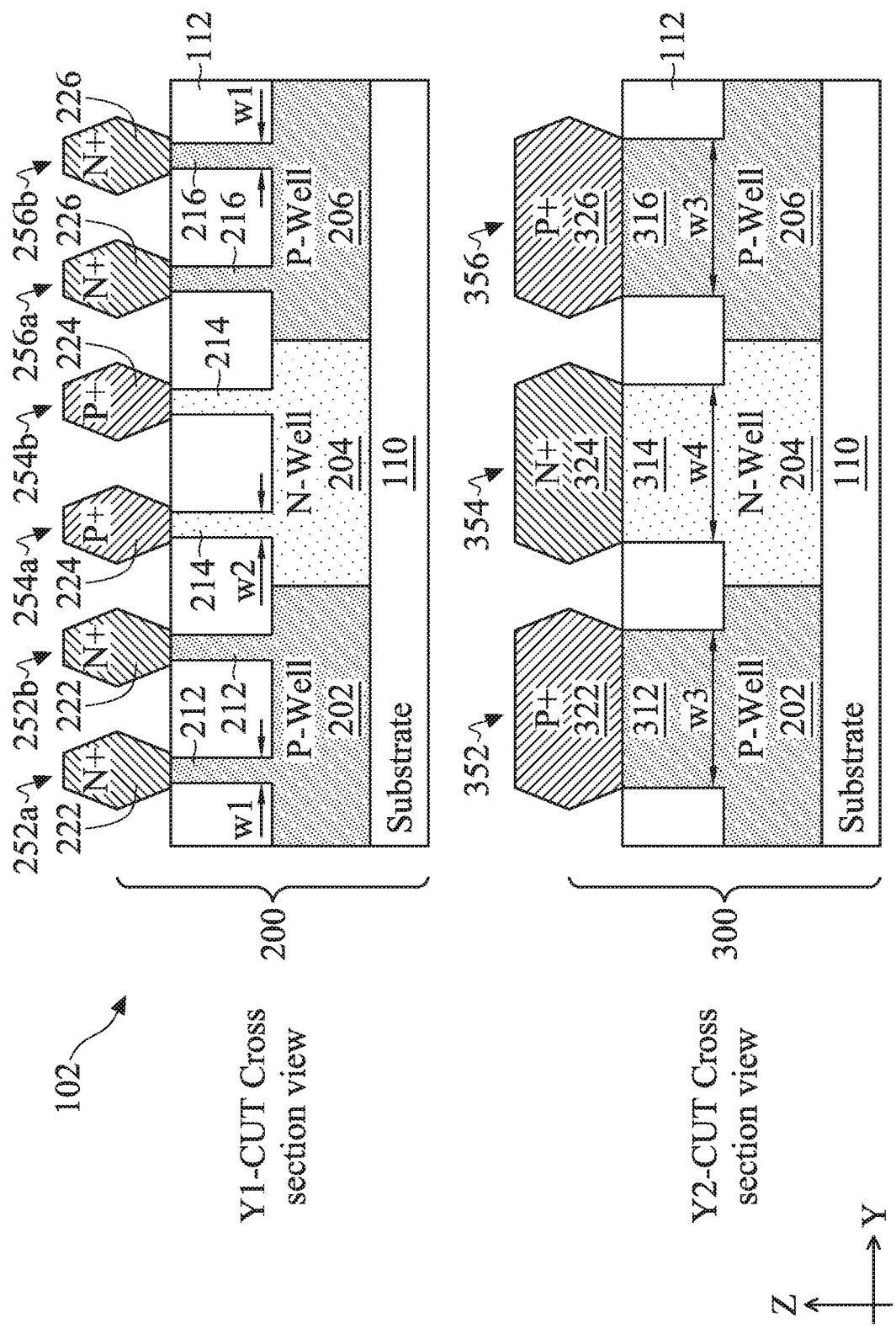
FIG. 2 shows two cross-sectional views of a portion of the memory macro in FIG. 1 along a widthwise direction of the active regions, in accordance with an embodiment.

Referring to FIG. 2, shown therein are cross-sectional views of the memory cell region 200 and the WPU region 300 along the Y1-CUT line and the Y2-CUT line of FIG. 1, respectively, in accordance with an embodiment. As shown in FIG. 2, the memory macro 102 includes a substrate 110. The various wells 202, 204, and 206 are formed in or over the substrate 110.

The substrate 110 is a silicon substrate in the present embodiment. For example, it is a silicon wafer or a substrate comprising single crystalline silicon. Alternatively, the substrate 110 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

In an embodiment, the various wells 202, 204, and 206 are formed by doping various portions of the substrate 110. The P wells (e.g., wells 202 and 206) may be formed by creating a doping mask using photolithography where the doping mask covers regions of the substrate 110 corresponding to the N wells (e.g., well 204), doping the substrate 110 that is not covered by the doping mask with one or more p-type dopants, and removing the doping mask. The doped regions of the substrate 110 become the P wells. The N wells may be formed similarly.

As shown in FIGS. 1 and 2, each of the active regions 212, 214, 216, 312, 314, and 316 is in the form of a fin extending from the respective well. Therefore, the active regions 212, 214, 216, 312, 314, and 316 are also referred to as fins 212, 214, 216, 312, 314, and 316, respectively. In the present embodiment, each of the fins 212, 214, 216, 312, 314, and 316 is of the same material as the substrate 110, such as comprising single crystalline silicon. In the present embodiment, all the fins extending from the P wells in the memory cell region 200 have the same width w1, all the fins extending from the N wells in the memory cell region 200 have the same width w2, all the fins extending from the P wells in the WPU region 300 have the same width w3, and all the fins extending from the N wells in the WPU region 300 have the same width w4. The above widths are dimensions measured along the Y direction.

In the present embodiment, the widths w1 and w2 are designed to be as narrow as allowable by the manufacture process, thereby increasing the memory cell density. For example, each of the widths w1 and w2 is designed to be in the range of 6 nm to 20 nm in an embodiment (that can be patterned using EUV (extreme ultraviolet) lithography or other advanced lithography processes). At the same time, the widths w3 and w4 are designed to be as wide as possible while conforming to the following rules. First, the widths w3 and w4 do not exceed the width of the respective wells 202, 204, and 206. Second, to provide design margin (e.g., for photolithography and etching), the spacing S2 is provided between adjacent fins in the WPU region 300 as discussed above. In an embodiment, each of the widths w3 and w4 is designed to be equal to the width of the respective well minus the spacing S2. Since the fins 312, 314, and 316 are part of the electrical path from a pickup cell source/drain (e.g., source/drain 322) to the respective well, keeping them wide reduces the resistance of the pickup cells and reducing the likelihood of latch-up issues in the respective well. In an embodiment, each of the widths w3 and w4 is designed to be in a range of 10 nm to 100 nm, such as from 10 nm to 60 nm.

In the present embodiment, since the fins 312 and 212 extend from the same well 202, the width of the fin 312 is designed to be a multiple of the width of the fin 212. Particularly, the width w3 of the fin 312 may be designed to be 3 times to 10 times of the width w1 of the fin 212 to simplify the manufacturing process. For example, referring to FIG. 1, the fin 312 and the two fins 212 over the well 202 may be designed to have their respective top and bottom sides to align along the X direction, i.e., the top side of the fin 312 is aligned with the top side of the very first fin 212 (counting from the top of the page of FIG. 1) and the bottom side of the fin 312 is aligned with the bottom side of the very last fin 212. When the fins 212 and 312 are patterned using a direct photolithography process such as EUV lithography, this configuration reduces optical proximity effects and increases pattern fidelity. When the fins 212 and 312 are patterned using a double patterning (or multiple patterning) process, this configuration reduces the complexity of the patterning process as the fins 212 and 312 may start with the same mandrel pattern, as will be explained later with reference to FIGS. 9a to 9e. When the width of the fins 212 are in the range of 6 nm to 20 nm, the spacing among the fins 212 along the Y direction is designed to be about the same as the width w1. For example, this allows the fin patterning process to be optimal. Therefore, the width w3 is at least equal to three times of the w1 in the above configuration. In some embodiments, there may be more than two parallel fins 212 in order to increase NMOS current in the memory cells. For example, there may be 3, 4, or 5 parallel fins 212 extending from the well 202. In those cases, the width w3 is designed to be 5, 7, or 9 times of w1, respectively, in the above configuration. In other words, the width w3 is designed to be equal to w1*((the number of fins 212)*2−1) in the present embodiment. The discussion about the fins 212 and 312 equally applies to the fins 216 and 316. In generally, the width w3 is in a range of 3 to 10 times of w1 in the present disclosure, whether or not w3 is a multiple of w1.

The above discussion about the configuration of the widths w1 and w3 similarly applies to the configuration of the widths w2 and w4. In short, w4 is designed to be a multiple of w2 in the present embodiment. Particularly, w4 may be designed to be 3 times to 10 times of w2 to simplify the manufacturing process. Also, the fin 314 and the two fins 214 may be designed to have their respective top and bottom sides to align along the X direction. In embodiments where there are 2, 3, 4, or 5 parallel fins 214 extending from the well 204, the width w4 is designed to be 3, 5, 7, or 9 times of w2, respectively. In generally, the width w4 is in a range of 3 to 10 times of w2 in the present disclosure, whether or not w4 is a multiple of w2.

FIG. 2 illustrates partial, cross-sectional views of various transistors in the memory cell region 200 and various pickup cells in the WPU region 300. Referring to FIG. 2, the memory cell region 200 includes NMOS transistors 252a and 252b over the P well 202, PMOS transistors 254a and 254b over the N well 204, and NMOS transistors 256a and 256b over the P well 206. The WPU region 300 includes p-type pickup cell 352 over the P well 202, n-type pickup cell 354 over the N well 204, and p-type pickup cell 356 over the P well 206. The NMOS transistors 252a/b and 256a/b include n-type doped epitaxial source/drain features 222 and 226 over the fins 212 and 216 respectively. The PMOS transistors 254a/b include p-type doped epitaxial source/drain features 224 over the fins 214. The p-type pickup cells 352 and 356 include p-type doped epitaxial source/drain features 322 and 326 over the fins 312 and 316 respectively. The n-type pickup cells 354 includes an n-type doped epitaxial source/drain features 324 over the fin 314. Each of the epitaxial features 322 and 326 is wider than the epitaxial features 222 and 226 along the Y direction. For example, each of the epitaxial features 322 and 326 is 3 to 10 times as wide as the epitaxial features 222 and 226 along the Y direction. The epitaxial feature 324 is wider than the epitaxial features 224 along the Y direction. For example, the epitaxial feature 324 is 3 to 10 times as wide as the epitaxial features 224 along the Y direction. In an embodiment, each of the n-type doped source/drain features 222, 226, and 324 may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In an embodiment, each of the p-type doped source/drain features 224, 322, and 326 may include silicon germanium or germanium and may be doped with boron, other p-type dopant, or combinations thereof (for example, forming Si:Ge:B epitaxial source/drain features). The epitaxial source/drain features may be formed by etching trenches into the respective fins, and epitaxially growing semiconductor material(s) in the trenches using CVD deposition techniques (for example, vapor phase epitaxy), molecular beam epitaxy, other suitable epitaxial growth processes, or combinations thereof.

Figure 3:
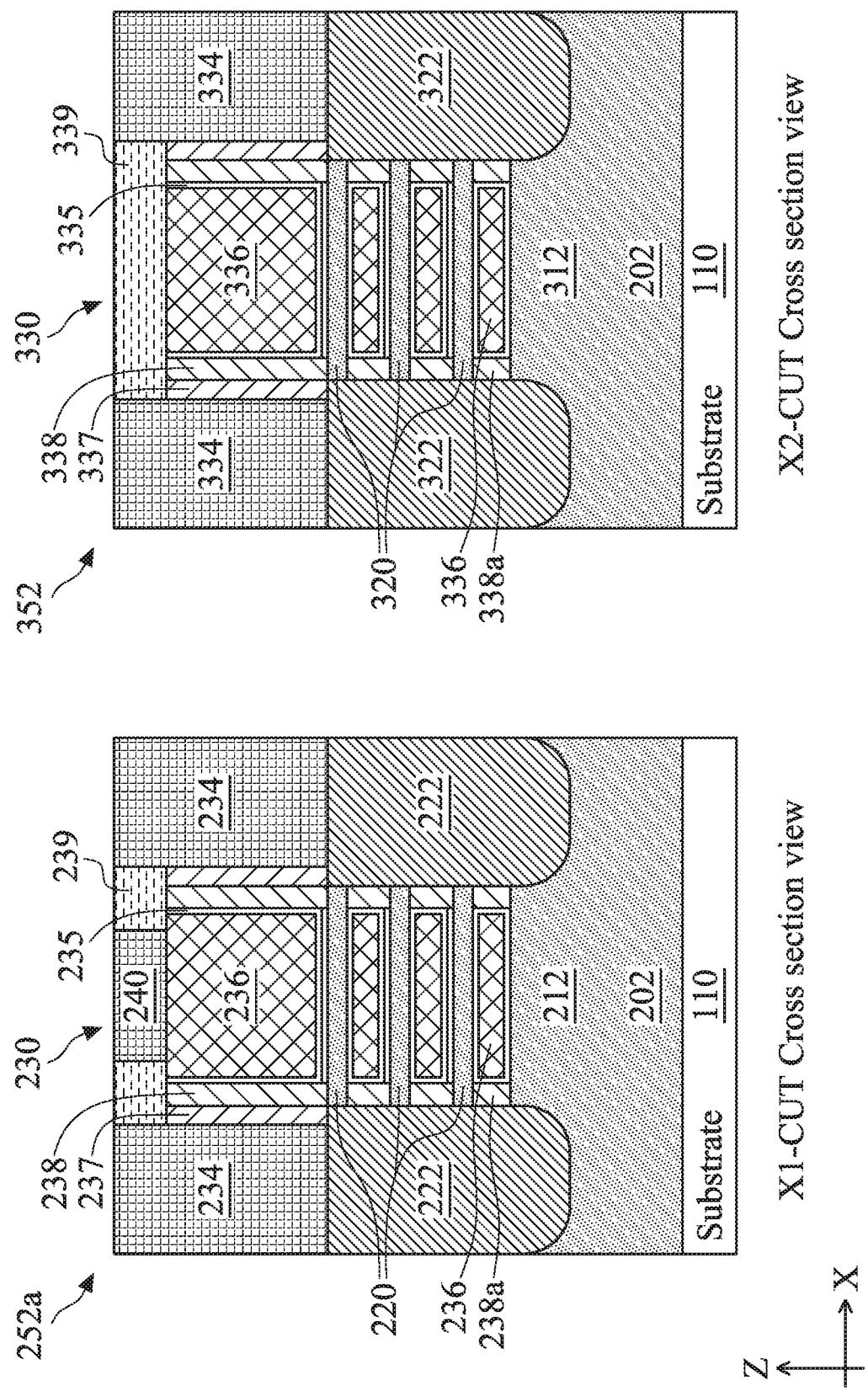
FIG. 3 shows two cross-sectional views of a portion of the memory macro in FIG. 1 along a lengthwise direction of the active regions, in accordance with an embodiment.

FIG. 3 illustrates partial, cross-sectional views of the transistor 252a and the pickup cell 352 along the X1-CUT and X2-CUT of FIG. 1, respectively. Referring to FIG. 3, the transistor 252a further includes multiple semiconductor layers 220 connecting the epitaxial source/drain features 222, a gate stack 230 between the epitaxial source/drain features 222 and engaging the semiconductor layers 220, a gate spacer 238 on sidewalls of the gate stack 230, an inner spacer 238a, an etch stop layer 237, source/drain contacts 234, a dielectric layer 239, and a gate contact 240. The gate stack 230 includes a conductive gate electrode 236 and one or more gate dielectric layers 235. Portions of the gate stack 230 are disposed vertically (along Z direction) between two adjacent semiconductor layers 220. The inner spacer 238a is disposed laterally (along X direction) between those portions of the gate stack 230 and the source/drain features 222. The pickup cell 352 is structured similarly and includes multiple semiconductor layers 320 connecting the epitaxial source/drain features 322, a gate stack 330 between the epitaxial source/drain features 322 and engaging the semiconductor layers 320, a gate spacer 338 on sidewalls of the gate stack 330, an inner spacer 338a, an etch stop layer 337, source/drain contacts 334, and a dielectric layer 339. The gate stack 330 includes a conductive gate electrode 336 and one or more gate dielectric layers 335. The pickup cell 352 does not have a gate contact connecting to the gate electrode 336. Rather, the top of the gate electrode 336 is fully covered by the dielectric layer 339.

The semiconductor layers 220 and 320 may include silicon, germanium, silicon germanium, or another suitable semiconductor material(s). The semiconductor layers 220 and 320 may be formed using the same process, which is briefly described below using the semiconductor layers 320 as example. Initially, the semiconductor layers 320 are formed as part of a semiconductor layer stack that includes the semiconductor layers 320 and other semiconductor layers of a different material. The semiconductor layer stack is patterned into a shape of a fin using one or more photolithography processes, including double-patterning or multi-patterning processes (e.g., using the same process that forms the fin 312). During a gate replacement process to form the gate stacks 330, the semiconductor layer stack is selectively etched to remove the other semiconductor layers, leaving the semiconductor layers 320 suspended over the substrate 110.

Each of the gate dielectric layer 235 and 335 may include an interfacial layer and/or a high-k dielectric layer. The interfacial layer may include a dielectric material, such as $SiO_2$, HfSiO, SiON, other silicon-comprising dielectric material, other suitable dielectric material, or combinations thereof. The interfacial layer may be formed by thermal oxidation, chemical oxidation, ALD, CVD, other suitable process, or combinations thereof. The high-k dielectric layer may include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The high-k dielectric layer may be formed by any of the processes described herein, such as ALD, CVD, PVD, oxidation-based deposition process, other suitable process, or combinations thereof.

Each of the conductive gate electrodes 236 and 336 may include a work function metal layer and a bulk metal layer. Because the transistor 252a is an NMOSFET, the work function metal layer of the gate electrode 236 provides an n-type work function. On the other hand, the gate electrode 336 is not actually used in the IC 100 (there is no gate contact connecting to the gate electrode 336), its work function can be an n-type work function metal or a p-type work function metal. However, to make the process flow consistent between the memory cell transistors and the pickup cells, gate electrodes on p-type pickup cells (i.e., having p-type doped source/drain) are formed with p-type work function, and gate electrodes on n-type pickup cells (i.e., having n-type doped source/drain) are formed with n-type work function, in the present embodiment. Therefore, the gate electrode 336 is formed with a p-type work function. Even though not shown in FIG. 3, a gate electrode on the transistor 254a/b provides a p-type work function for the PMOSFET, a gate electrode on the transistor 256a/b provides an n-type work function for the NMOSFET, a gate electrode on the pickup cell 354 is formed with an n-type work function, and a gate electrode on the pickup cell 356 is formed with a p-type work function. P-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. The work function metal layer may be formed using a suitable deposition process, such as CVD, PVD, HDPCVD, MOCVD, RPCVD, PECVD, LPCVD, ALCVD, APCVD, plating, other deposition process, or combinations thereof. The bulk metal layer of the gate electrodes 236 and 336 includes a suitable conductive material, such as Co, Al, W, and/or Cu. The bulk metal layer may additionally or collectively include other metals, metal oxides, metal nitrides, other suitable materials, or combinations thereof. Further, the metallic gate electrodes 236 and 336 may be different portions of the same metallic layer(s). The gate dielectric layer 235 and the gate electrode layer 236 are also formed between the semiconductor layers 220 (i.e., the transistor 252a is a nanosheet device or a gate-all-around device). The gate dielectric layer 335 and the gate electrode layer 336 are also formed between the semiconductor layers 320 (i.e., the pickup cell 352 is a nanosheet pickup cell or a gate-all-around pickup cell). In an alternative embodiment, the transistor 252a is a FinFET device (i.e., there is a single semiconductor layer 220 and it is connected to the fin 212), but the pickup cell 352 is still a nanosheet pickup cell or a gate-all-around pickup cell.

The spacers 238, 238a, 338, and 338a may be formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)).

The etch stop layers 237 and 337 may be different portions of the same etch stop layer and may include silicon and nitrogen, such as silicon nitride or silicon oxynitride. The contacts 234, 240, and 334 include a conductive material, such as aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. The dielectric layer 339 may include a dielectric material such as silicon oxide, silicon nitride, silicon oxynitride, TEOS formed oxide, phosphosilicate glass (PSG), low-k dielectric material, other suitable dielectric material, or combinations thereof.

Figure 4:
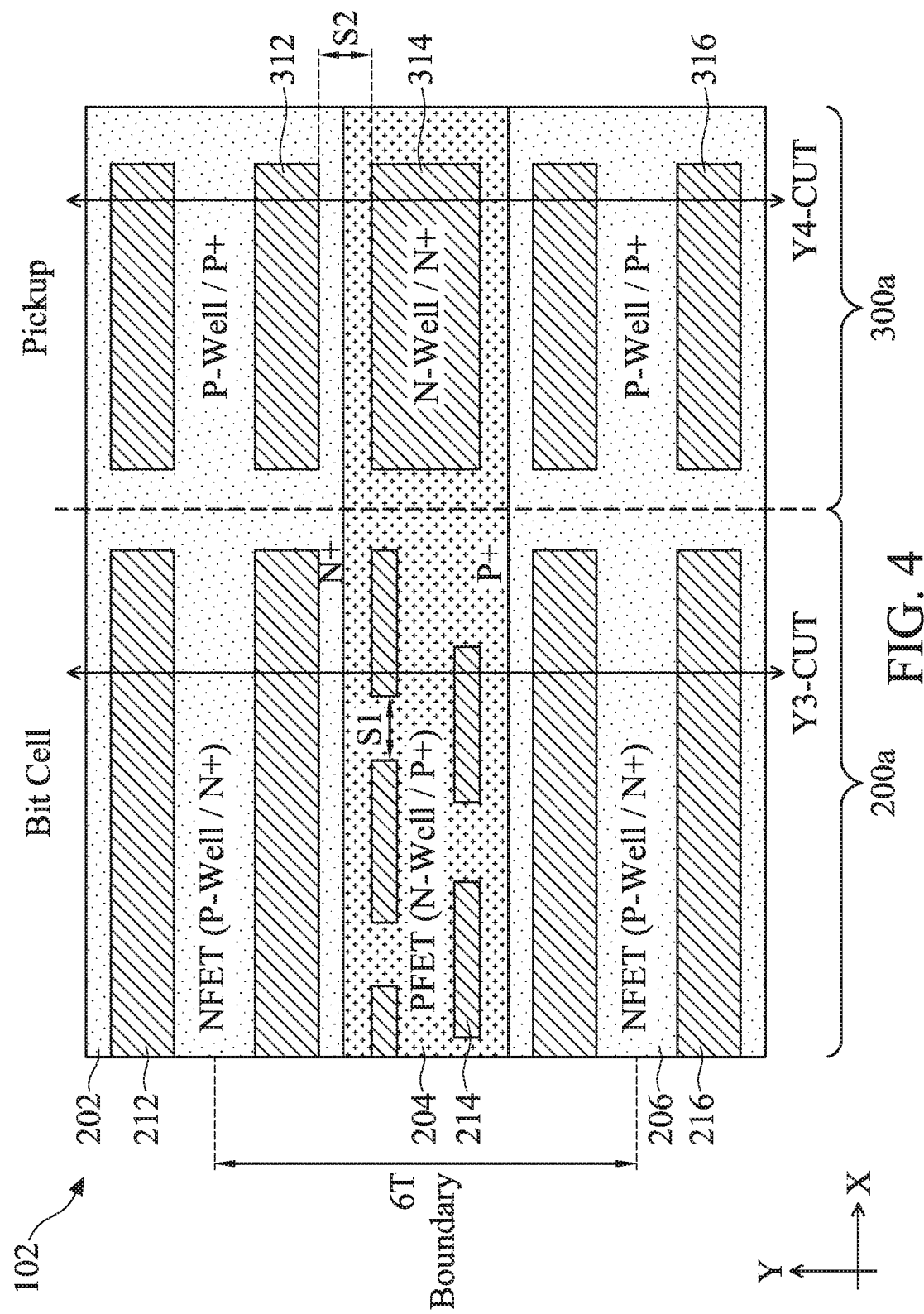
FIG. 4 shows a top view of a portion of the memory macro in FIG. 1 with a high-current SRAM cell, in accordance with an embodiment.
Figure 5:
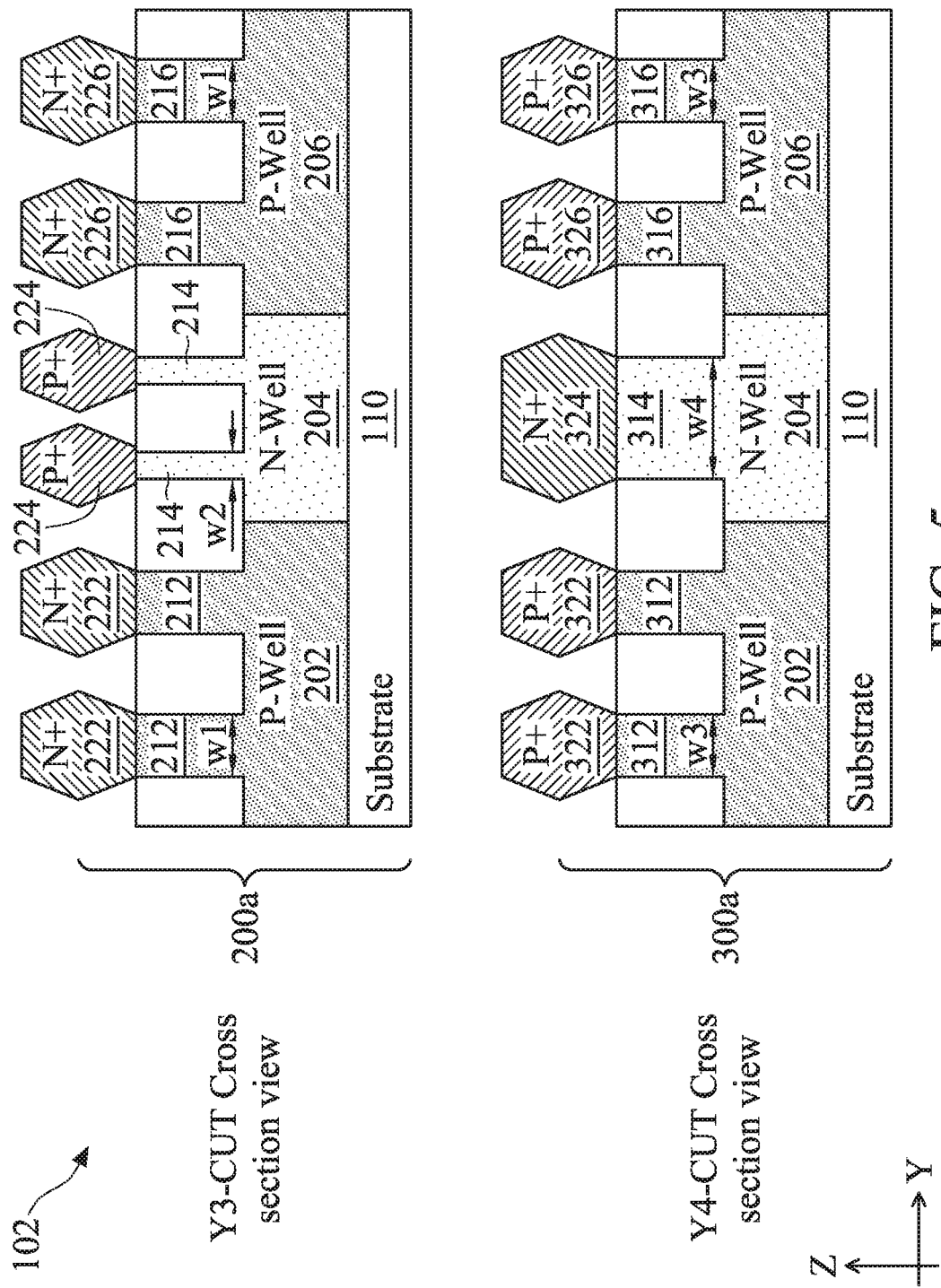
FIG. 5 shows two cross-sectional views of a portion of the memory macro in FIG. 4 along a width direction of the active regions, in accordance with an embodiment.

FIG. 4 shows a top view (a layout) of another portion of the memory macro 102 in FIG. 1. Referring to FIG. 4, the memory macro 102 includes another memory cell region 200a and another WPU region 300a. FIG. 5 shows partial and cross-sectional views of the memory cell region 200a and the WPU region 300a along the Y3-CUT line and the Y4-CUT line of FIG. 4, respectively. Many features of the memory cell region 200a and the WPU region 300a are the same as or substantially same as those of the memory cell region 200 and the WPU region 300, respectively. Therefore, some of their details are omitted. Instead, like features are indicated with like reference numerals.

Referring to FIGS. 4 and 5 collectively, alternatingly arranged P wells (e.g., 202 and 206) and N wells (e.g., 204) extend across the memory cell region 200a and the WPU region 300a. Active regions (or fins) 212, 214, 216, 312, 314, and 316 extend from the wells and are oriented lengthwise along the X direction. The fins (e.g., 212, 216) over the P wells are wider than the fins (e.g., 214) over the N wells in the memory cell region 200a. In an embodiment, each of the fins 212 and 216 is at least twice as wide as the fin 214. In other words, the width w1 is at least twice as the width w2. This configuration provides high current in the NFET (i.e., the memory cell region 200a has high current memory cells). There are at least two fins 212 (216) over each P well 202 (206). The number of fins 312 (316) is equal to the number of fins 212 (216). The width w3 is about the same as the width w1. This simplifies the patterning process that produces the fins 212 and 312. The width w4 is at least three times of the width w2. Particularly, w4 may be designed to be 3 times to 10 times of w2 to simplify the manufacturing process. In embodiments where there are 2, 3, 4, or 5 parallel fins 214 extending from the well 204, the width w4 may be designed to be 3, 5, 7, or 9 times of w2, respectively.

Figure 6:
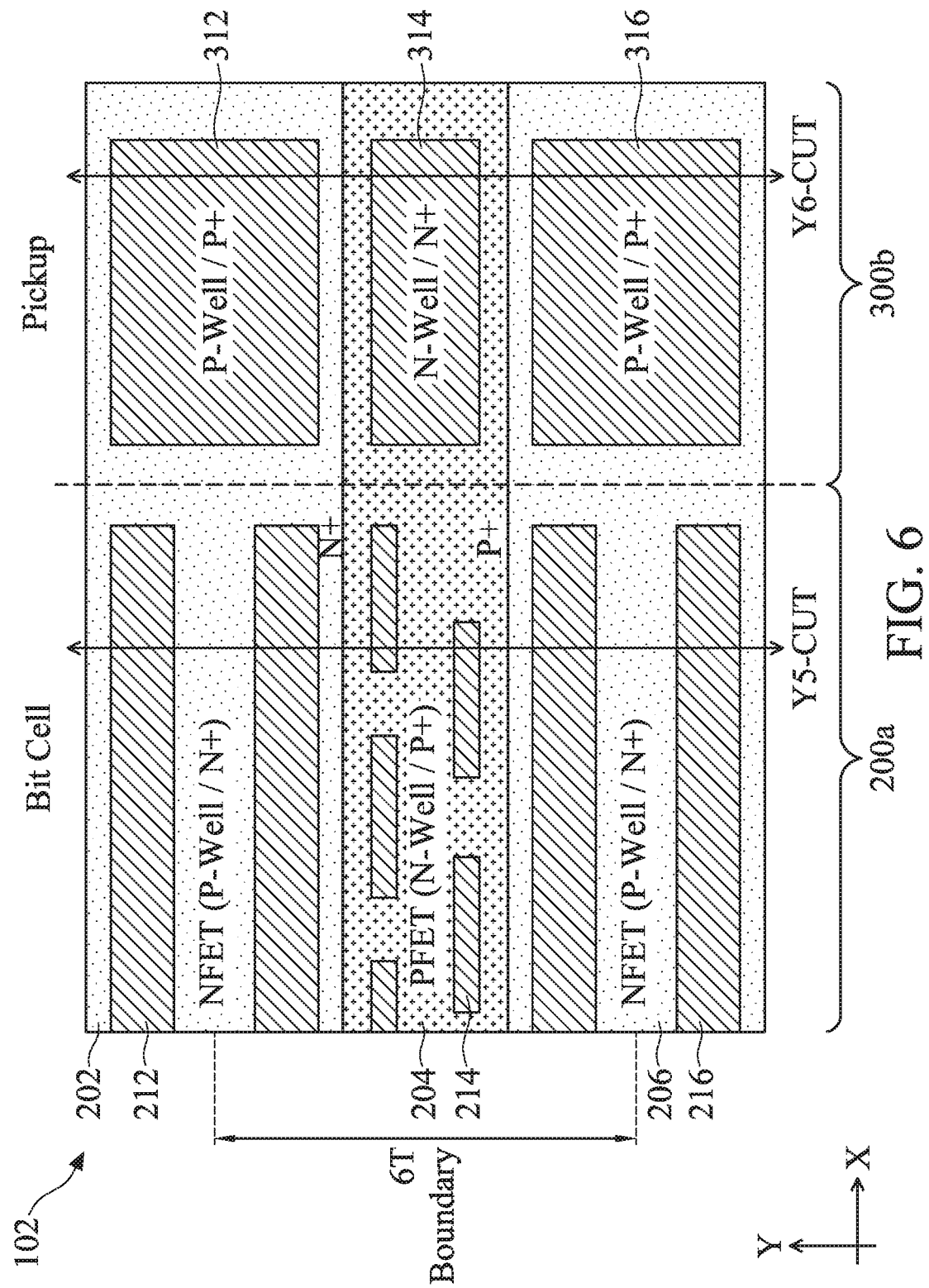
FIG. 6 shows a top view of a portion of the memory macro in FIG. 1 with a high-current SRAM cell, in accordance with another embodiment.
Figure 7:
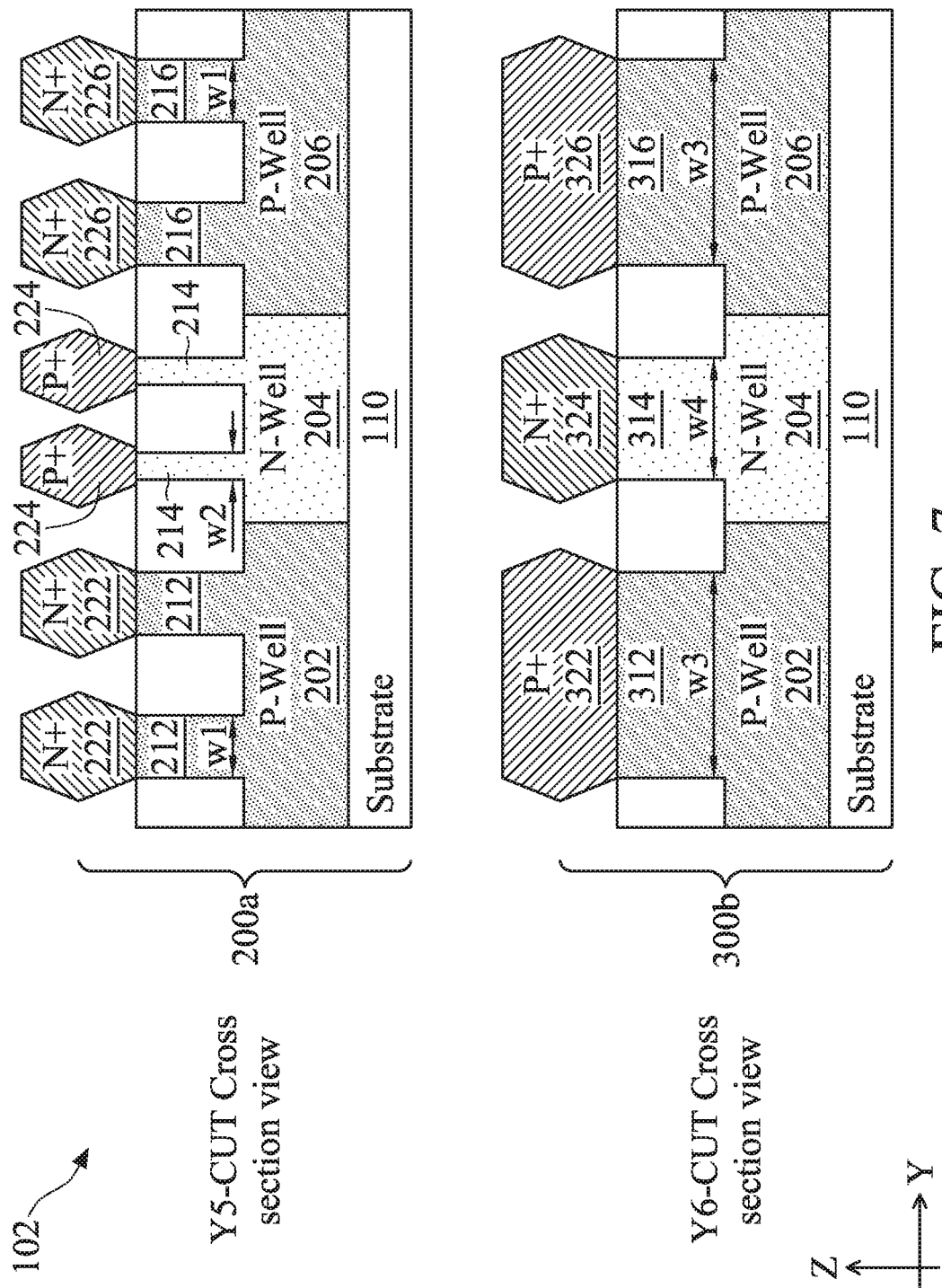
FIG. 7 shows two cross-sectional views of a portion of the memory macro in FIG. 6 along a width direction of the active regions, in accordance with an embodiment.

FIG. 6 shows a top view (a layout) of another portion of the memory macro 102 in FIG. 1. Referring to FIG. 6, the memory macro 102 includes a memory cell region 200a and another WPU region 300b. FIG. 7 shows partial and cross-sectional views of the memory cell region 200a and the WPU region 300b along the Y5-CUT line and the Y6-CUT line of FIG. 6, respectively. Features of the memory cell region 200a has been discussed above. Many features of the WPU region 300b are the same as or substantially same as those of the WPU region 300. Therefore, some of its details are omitted. Instead, like features are indicated with like reference numerals.

Referring to FIGS. 6 and 7 collectively, alternatingly arranged P wells (e.g., 202 and 206) and N wells (e.g., 204) extend across the memory cell region 200a and the WPU region 300b. Active regions (or fins) 212, 214, 216, 312, 314, and 316 extend from the wells and are oriented lengthwise along the X direction. The fins (e.g., 212, 216) over the P wells are wider than the fins (e.g., 214) over the N wells in the memory cell region 200a. In an embodiment, each of the fins 212 and 216 is at least twice as wide as the fin 214. There are at least two fins 212 (216) over each P well 202 (206) in the memory cell region 200a. However, there is only one fin 312 (316) over each P well 202 (206) in the WPU region 300b. Particularly, w3 is designed to be 3 times to 10 times of w1 to simplify the manufacturing process. Also, the fin 312 and the two fins 212 may be designed to have their respective top and bottom sides to align along the X direction as discussed above with reference to FIG. 1. In embodiments where there are 2, 3, 4, or 5 parallel fins 212 extending from the well 202, the width w3 is designed to be 3, 5, 7, or 9 times of w1, respectively. The width w4 is at least three times of the width w2. Particularly, w4 may be designed to be 3 times to 10 times of w2 to simplify the manufacturing process. In embodiments where there are 2, 3, 4, or 5 parallel fins 214 extending from the well 204, the width w4 is designed to be 3, 5, 7, or 9 times of w2, respectively.

Figure 8:
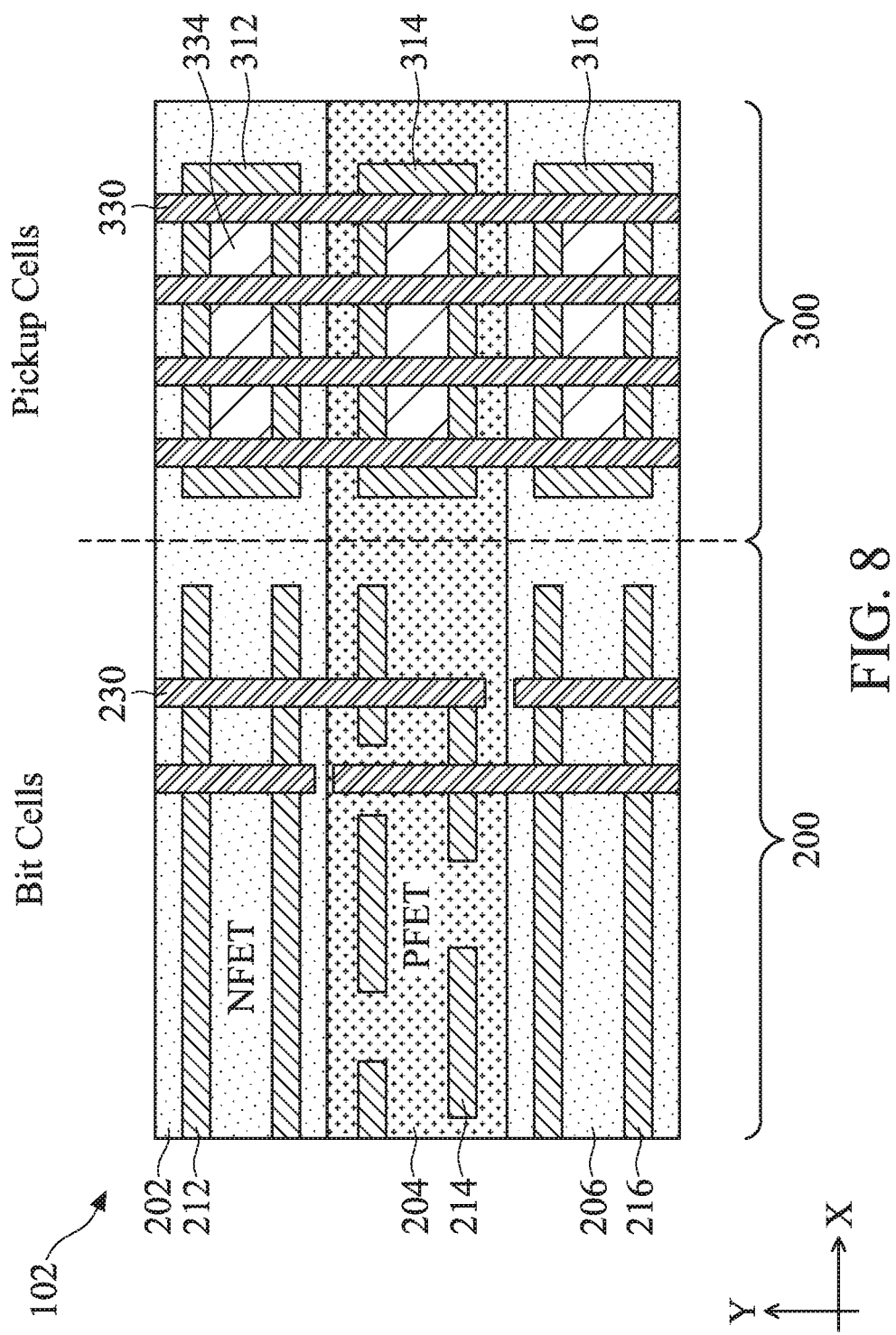
FIG. 8 shows a top view of the portion of the memory macro in FIG. 1 with gate stacks and source/drain contacts over the active regions, in accordance with an embodiment.

FIG. 8 illustrates a top view (a layout) of the portion of the memory macro 102 in FIG. 1 in accordance with an embodiment. Particularly, FIG. 8 illustrates the gate stacks 230 and 330 oriented lengthwise along the Y direction. The gate stacks 230 engage the various fin active regions 212, 214, and 216 (or nanosheet channels thereon) to form the transistors of the memory cells. The gate stacks 330 are disposed over the active regions 312, 314, and 316. As discussed above, the gate stacks 330 do not function as a transistor gate because there is no gate contact connecting to them. They are nonetheless formed in the memory macro 102 for pattern loading purposes—i.e., increasing the pattern fidelity when fabricating the gate stacks 230. FIG. 8 further illustrates source/drain contacts 334 disposed over the active regions 312, 314, and 316. Well bias voltages are supplied to the wells 202, 204, and 206 through the source/drain contacts 334. In the present disclosure, because the active regions 312, 314, and 316 are designed to have a wide body (e.g., 3 to 10 times as wide as the active regions 212, 214, 216 in some embodiments), the resistance in the well bias path is reduced, which reduces the likelihood of latch-up in the memory macro 102. Even though not shown in FIG. 8, there are source/drain contacts and gate contacts in the memory cell region 200.

The active regions 212, 214, 216, 312, 314, and 316 in the various embodiments of the present disclosure may be fabricated using a photolithography process and one or more etching processes. The photolithography process includes forming a hard mask layer over the substrate 110, coating a photoresist layer over the hard mask layer, exposing the photoresist layer to radiation (e.g., EUV or 193 nm DUV immersion), developing the exposed photoresist layer, removing certain areas of the photoresist layer to form a patterned resist, etching the hard mask layer using the patterned resist to form patterned hard mask, and etching the substrate 110 using the patterned hard mask or a pattern derived therefrom. The etching process can be a dry etching, a wet etching, or a combination thereof. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, the wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

In the present embodiment, since the active regions 212, 214, 216, 312, 314, and 316 may have different widths and some of the widths is only 20 nm or less, a direct patterning using EUV lithography may be employed to produce the patterns. Alternatively, the layout of the present disclosure also enables double patterning using a less expensive lithography tool, such as 193-nm immersion lithography, to produce the patterns. One example process flow is illustrated in FIGS. 9a-9e for fabricating patterns for the layout shown in FIG. 1, according to an embodiment. The process flow can be varied for fabricating patterns for the layout shown in FIG. 4 and FIG. 6.

As shown in FIGS. 9a-1 and 9a-2 (FIG. 9a-1 shows a top view of the patterns, while FIG. 9a-2 shows cross-sectional views of the patterns along the A-A and B-B lines in FIG. 9a-1), the process flow starts with forming mandrel patterns 402 over the wells 202, 204, and 206. The mandrel patterns 402 include a hard mask material (e.g., silicon dioxide, silicon nitride, or other suitable material). The mandrel patterns 402 are formed as regular line patterns and have a width that is wide enough to be directly formed (or resolved) by 193-nm immersion lithography. The photolithography process has been explained above.

Figures 1, 9B:
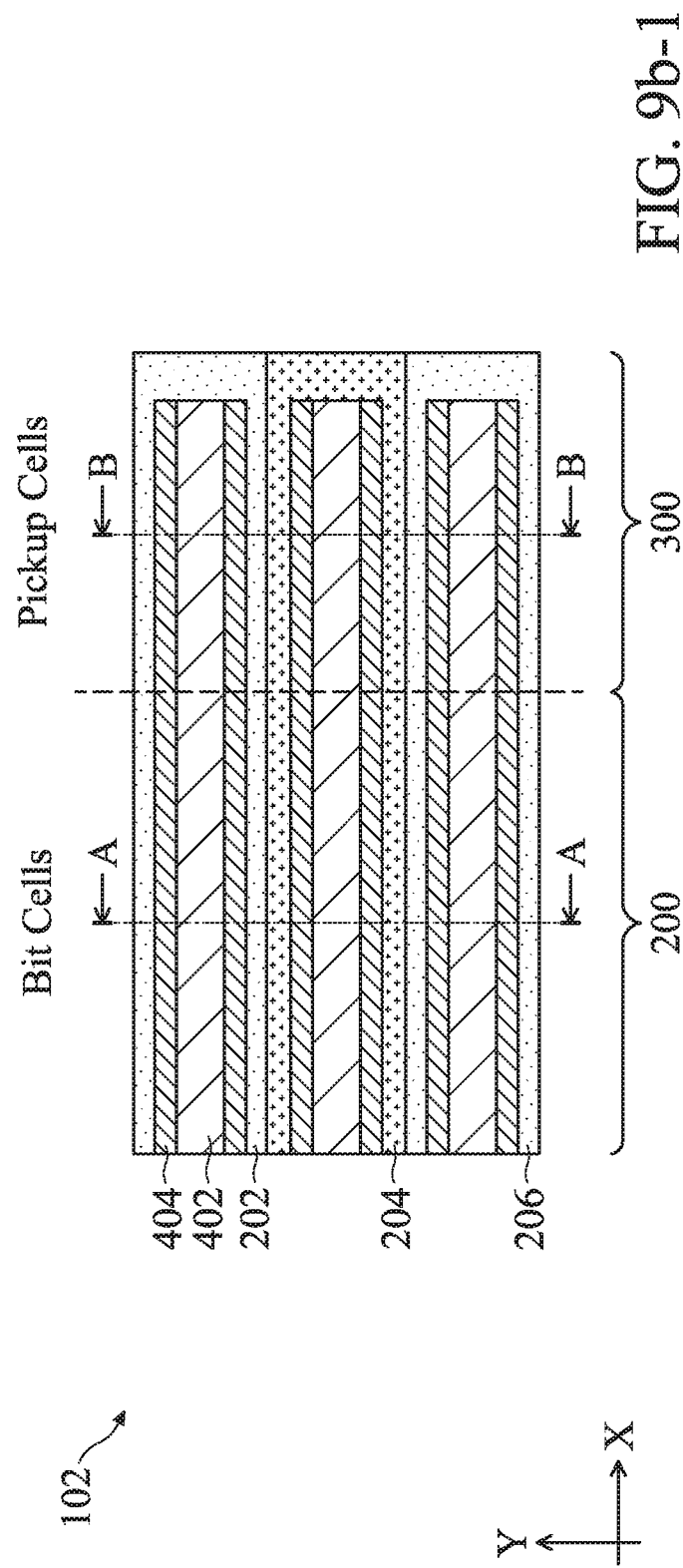
Figures 2, 9B:
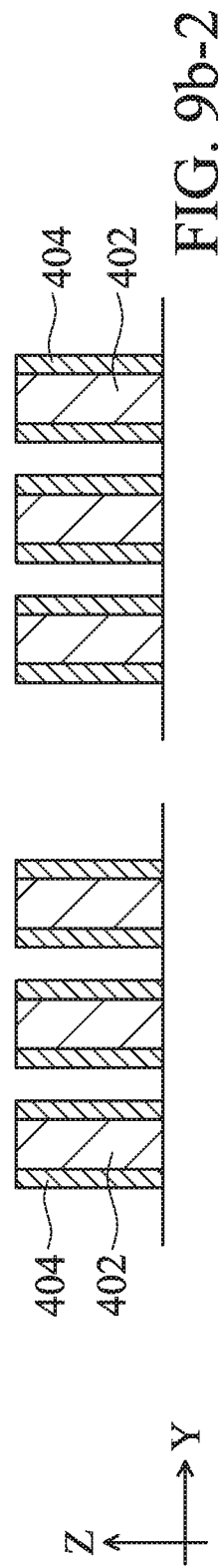

As shown in FIGS. 9b-1 and 9b-2 (FIG. 9b-1 shows a top view of the patterns, while FIG. 9b-2 shows cross-sectional views of the patterns along the A-A and B-B lines in FIG. 9b-1), a spacer 404 is formed on sidewalls of the mandrel patterns 402. The spacer 404 includes a different material than the mandrel patterns 402. The spacer 404 may be formed by conformally depositing a material layer over the top and sidewalls of the mandrel patterns 402 and over the substrate 110 and then anisotropically etching the material layer. The thickness of the spacer 404 corresponds to the width of the fin active regions (e.g., w1).

As shown in FIGS. 9c-1 and 9c-2 (FIG. 9c-1 shows a top view of the patterns, while FIG. 9c-2 shows cross-sectional views of the patterns along the A-A and B-B lines in FIG. 9c-1), the mandrel patterns 402 in the memory cell region 200 is selectively removed. This can be achieved by forming a mask 405 (e.g., a patterned photoresist) covering the WPU region 300 and performing an etching process in the memory cell region 200 that is selective to the materials of the mandrel patterns 402. The mask is subsequently removed.

Figure 9D:
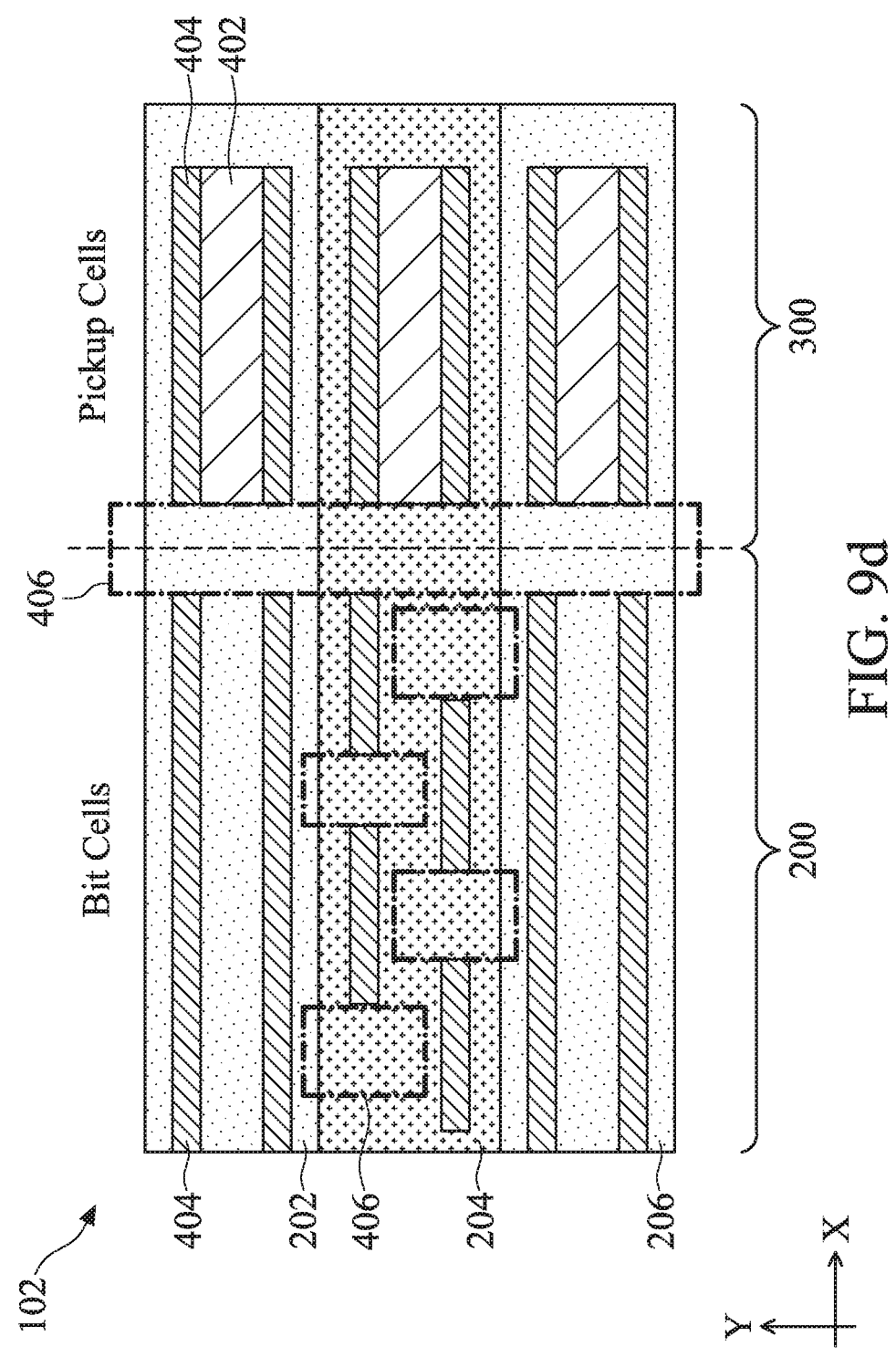

As shown in FIG. 9d, the mandrel patterns 402 and the spacer 404 are partially removed by a cut process. For example, another hard mask pattern (cut pattern) is formed over the mandrel patterns 402 and the spacer 404. The cut pattern provides openings 406 that expose portions of the mandrel patterns 402 and the spacer 404 while covering the rest of the mandrel patterns 402 and the spacer 404. Then the mandrel patterns 402 and the spacer 404 are etched through the openings 406, and the cut pattern is removed thereafter.

Figure 9E:
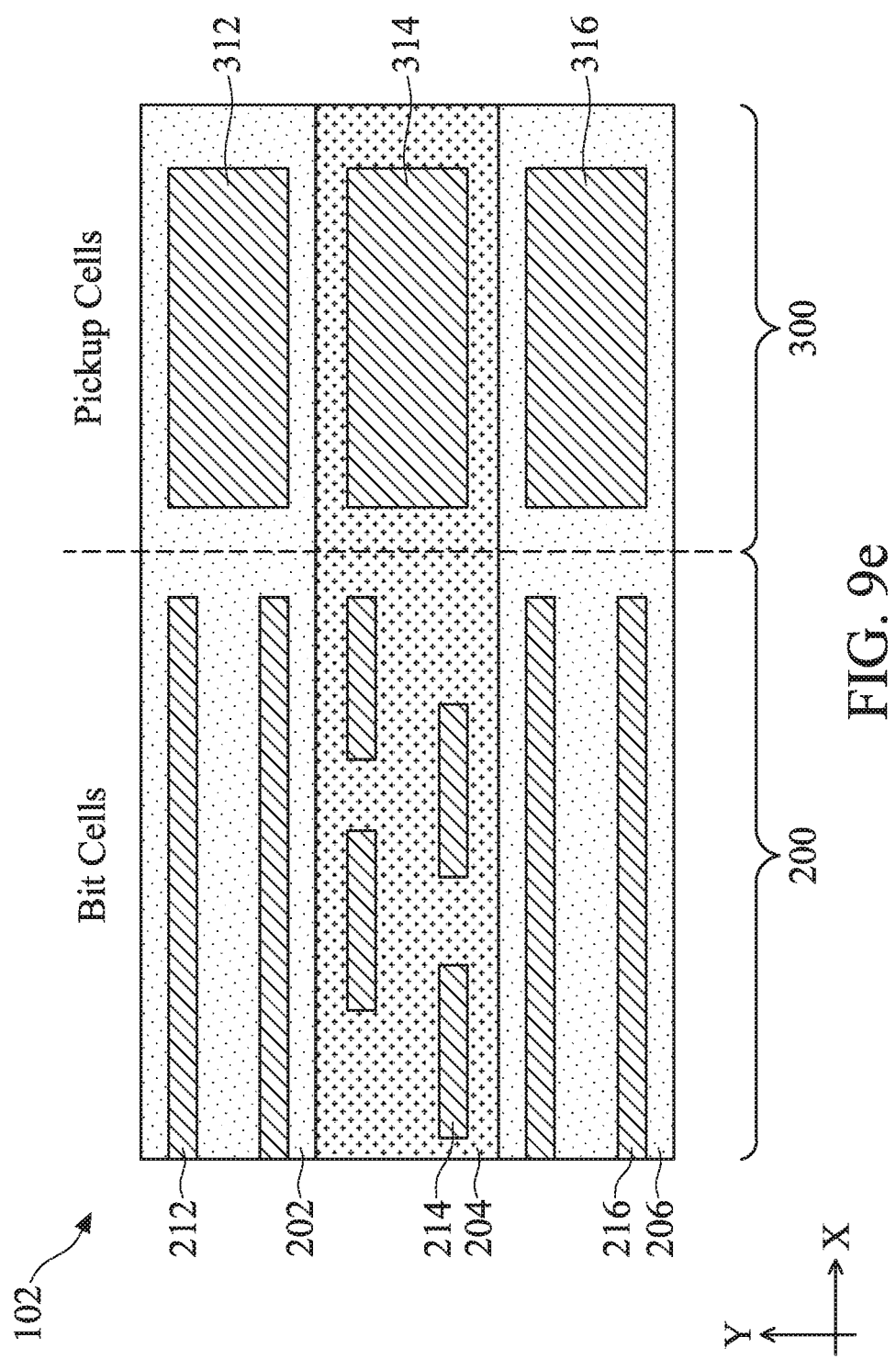

As shown in FIG. 9e, the substrate 110 is etched using the remaining portions of the mandrel patterns 402 and the spacer 404 as a mask to form the active regions 212, 214, 216, 312, 314, and 316. In an embodiment, the width of the mandrel pattern 402 is designed to be about the same as the thickness of the spacer 404, which results in the width of the active regions 312, 314, and 316 to be three times of the width of the active regions 212, 214, and 216.

Although not intended to be limiting, one or more embodiments of the present disclosure provide many benefits to a semiconductor device and the formation thereof. For example, embodiments of the present disclosure provide well pickup cells with wide fin body and low resistance, which effectively reduces the resistance for well pickup structures and reduces the likelihood of latch-up compared to designs where well pickup cells have the same fin width as the memory cells. The disclosed layout can be patterned using EUV direct lithography or using mandrel-spacer double patterning or a combination of the two. Therefore, it can be readily integrated into existing semiconductor manufacturing processes.

In one example aspect, the present disclosure is directed to a semiconductor device. The semiconductor device includes a substrate having a first well of a first conductivity type, a first transistor, and a memory pickup cell. The first transistor includes a first fin extending from the first well and having a first width and two first source/drain features on the first fin. The first fin is of the first conductivity type. The two first source/drain features are of a second conductivity type that is opposite to the first conductivity type. The memory pickup cell includes a second fin extending from the first well and having a second width that is at least three times of the first width, two second source/drain features on the second fin, and a stack of semiconductor layers over the second fin and connecting the two second source/drain features. The second fin and the two second source/drain features are of the first conductivity type.

In some embodiment of the semiconductor device, the second width is no more than 10 times of the first width. In some embodiment of the semiconductor device, the first transistor further includes a first gate stack disposed between the two first source/drain features and a gate contact electrically connecting to the first gate stack, and the memory pickup cell further includes a second gate stack disposed between the two second source/drain features and is free of any gate contact electrically connecting to the second gate stack.

In some embodiment of the semiconductor device, the first conductivity type is n-type and the second conductivity type is p-type. In some alternative embodiment of the semiconductor device, the first conductivity type is p-type and the second conductivity type is n-type.

In some embodiment of the semiconductor device, the first transistor and the memory pickup cell are in a same memory macro of the semiconductor device. In some embodiment, the second width is in a range of 10 nm to 100 nm.

In some embodiment, the semiconductor device further includes a second transistor including a third fin extending from the first well and being of the first conductivity type. The third fin has a third width. The first and the third fins are lengthwise parallel to each other and are spaced away by first spacing along a widthwise direction. The second width is at least equal to a sum of the first width, the third width, and the first spacing.

In some embodiment where the substrate further includes a second well of the second conductivity type and abutting the first well, the semiconductor device further includes a second memory pickup cell including a third fin extending from the second well and a third source/drain feature on the third fin, wherein the third fin and the third source/drain feature are of the second conductivity type. The second and the third fins extend lengthwise along a same direction and are spaced away from each other along a widthwise direction by 20 nm to 60 nm.

In another example aspect, the present disclosure is directed to a semiconductor device that includes a substrate having an n-type well abutting a p-type well. The n-type well and the p-type well extend across a first region for memory bits and a second region for pickup cells. The semiconductor device further includes multiple first fin structures protruding from the p-type well in the first region and multiple second fin structures protruding from the n-type well in the first region. Each of the first fin structures has a first width, and each of the second fin structures has a second width. The semiconductor device further includes one or more third fin structures protruding from the p-type well in the second region and one or more fourth fin structures protruding from the n-type well in the second region. Each of the one or more third fin structures has a third width and each of the one or more fourth fin structures has a fourth width. The fourth width is at least three times of the second width.

In some embodiments, two of the multiple second fin structures are spaced away from each other by a first distance along a fin-width direction, and the fourth width is at least equal to a sum of the first distance and twice of the second width. In some embodiments, the first width is about equal to the third width and is at least twice of the second width. In some embodiments, the first width is about one third of the third width. In some embodiments, the first width is about equal to the second width and is less than one half of the third width. In some embodiments, the first width is at least twice of the second width.

In yet another example aspect, the present disclosure is directed to an integrated circuit (IC) layout. The IC layout includes a first region for memory bits and a second region for pickup cells; an n-type well extending in the first region and the second region; a p-type well extending in the first region and the second region; first active regions over the p-type well in the first region where each of the first active regions has a first width; second active regions over the n-type well in the first region where each of the second active regions has a second width; third active regions over the p-type well in the second region where each of the third active regions has a third width; and fourth active regions over the n-type well in the second region where each of the fourth active regions has a fourth width. The fourth width is at least three times of the second width, and the third width is at least equal to the first width.

In some embodiments, the third width is at least three times of the first width. In some embodiments, the first width is at least twice of the second width. In some embodiments, the fourth width is no more than 10 times of the second width. In some embodiments, the second width is in a range of 6 nm to 20 nm.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first well of a first conductivity type;
   a first transistor including:
      a first fin extending from the first well and having a first width, wherein the first fin is of the first conductivity type; and
      two first source/drain features on the first fin, wherein the two first source/drain features are of a second conductivity type that is opposite to the first conductivity type; and
   a memory pickup cell including:
      a second fin extending from the first well and having a second width that is at least three times of the first width;
      two second source/drain features on the second fin, wherein the second fin and the two second source/drain features are of the first conductivity type; and
      a stack of semiconductor layers over the second fin and connecting the two second source/drain features.

2. The semiconductor device of claim 1, wherein the second width is no more than 10 times of the first width.

3. The semiconductor device of claim 1, wherein the first transistor further includes a first gate stack disposed between the two first source/drain features and a gate contact electrically connecting to the first gate stack, and the memory pickup cell further includes a second gate stack disposed between the two second source/drain features and is free of any gate contact electrically connecting to the second gate stack.

4. The semiconductor device of claim 1, wherein the first conductivity type is n-type and the second conductivity type is p-type.

5. The semiconductor device of claim 1, wherein the first conductivity type is p-type and the second conductivity type is n-type.

6. The semiconductor device of claim 1, wherein the first transistor and the memory pickup cell are in a same memory macro of the semiconductor device.

7. The semiconductor device of claim 1, wherein the second width is in a range of 10 nm to 100 nm.

8. The semiconductor device of claim 1, further comprising:
   a second transistor including a third fin extending from the first well and being of the first conductivity type, the third fin having a third width,
   wherein the first and the third fins are lengthwise parallel to each other and are spaced away by first spacing along a widthwise direction, wherein the second width is at least equal to a sum of the first width, the third width, and the first spacing.

9. The semiconductor device of claim 1, wherein the substrate further includes a second well of the second conductivity type and abutting the first well, further comprising:
   a second memory pickup cell including:
      a third fin extending from the second well; and
      a third source/drain feature on the third fin, wherein the third fin and the third source/drain feature are of the second conductivity type,
   wherein the second and the third fins extend lengthwise along a same direction and are spaced away from each other along a widthwise direction by 20 nm to 60 nm.

10. A semiconductor device, comprising:
    a substrate having an n-type well abutting a p-type well, the n-type well and the p-type well extending across a first region for memory bits and a second region for pickup cells;
    multiple first fin structures protruding from the p-type well in the first region, each of the first fin structures having a first width;
    multiple second fin structures protruding from the n-type well in the first region, each of the second fin structures having a second width;
    one or more third fin structures protruding from the p-type well in the second region, each of the one or more third fin structures having a third width; and
    one or more fourth fin structures protruding from the n-type well in the second region, each of the one or more fourth fin structures having a fourth width, wherein the fourth width is at least three times of the second width.

11. The semiconductor device of claim 10, wherein two of the multiple second fin structures are spaced away from each other by a first distance along a fin-width direction, wherein the fourth width is at least equal to a sum of the first distance and twice of the second width.

12. The semiconductor device of claim 10, wherein the first width is about equal to the third width and is at least twice of the second width.

13. The semiconductor device of claim 10, wherein the first width is about one third of the third width.

14. The semiconductor device of claim 10, wherein the first width is about equal to the second width and is less than one half of the third width.

15. The semiconductor device of claim 10, wherein the first width is at least twice of the second width.

16. An integrated circuit (IC) layout, comprising:
    a first region for memory bits and a second region for pickup cells;
    an n-type well extending in the first region and the second region;
    a p-type well extending in the first region and the second region;
    first active regions over the p-type well in the first region, each of the first active regions having a first width;

second active regions over the n-type well in the first region, each of the second active regions having a second width;

third active regions over the p-type well in the second region, each of the third active regions having a third width; and fourth active regions over the n-type well in the second region, each of the fourth active regions having a fourth width, wherein the fourth width is at least three times of the second width, and the third width is at least equal to the first width.

17. The IC layout of claim 16, wherein the third width is at least three times of the first width.

18. The IC layout of claim 17, wherein the first width is at least twice of the second width.

19. The IC layout of claim 16, wherein the fourth width is no more than 10 times of the second width.

20. The IC layout of claim 16, wherein the second width is in a range of 6 nm to 20 nm.

* * * * *